United States Patent
Olsen

(10) Patent No.: US 7,429,540 B2
(45) Date of Patent: Sep. 30, 2008

(54) SILICON OXYNITRIDE GATE DIELECTRIC FORMATION USING MULTIPLE ANNEALING STEPS

(75) Inventor: Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/397,010

(22) Filed: Apr. 3, 2006

(65) Prior Publication Data
US 2006/0178018 A1    Aug. 10, 2006

Related U.S. Application Data

(63) Continuation-in-part of application No. 10/794,707, filed on Mar. 4, 2004.

(60) Provisional application No. 60/453,057, filed on Mar. 7, 2003.

(51) Int. Cl.
*H01L 21/31* (2006.01)
(52) U.S. Cl. ............... 438/786; 438/769; 438/775
(58) Field of Classification Search ............ 438/786, 438/770, 82, 787, 769, 775, 773, 791
See application file for complete search history.

(56) References Cited

U.S. PATENT DOCUMENTS

| | | | |
|---|---|---|---|
| 4,725,560 A | 2/1988 | Abernathey et al. | |
| 6,020,243 A | 2/2000 | Wallace et al. | |
| 6,063,704 A | 5/2000 | Demirlioglu | |
| 6,087,701 A | 7/2000 | Bergstrom et al. | |
| 6,136,654 A | 10/2000 | Kraft et al. | |
| 6,162,744 A * | 12/2000 | Al-Shareef et al. | 438/785 |
| 6,207,005 B1 | 3/2001 | Henley et al. | |
| 6,365,518 B1 | 4/2002 | Lee et al. | |
| 6,548,366 B2 | 4/2003 | Niimi et al. | |
| 6,632,747 B2 | 10/2003 | Niimi et al. | |
| 6,649,538 B1 | 11/2003 | Cheng et al. | |
| 6,780,720 B2 | 8/2004 | Burnham et al. | |
| 6,821,873 B2 | 11/2004 | Visokay et al. | |
| 2001/0049186 A1 | 12/2001 | Ibok | |
| 2002/0004279 A1 | 1/2002 | Agarwal et al. | |
| 2002/0142624 A1 * | 10/2002 | Levy et al. | 438/786 |
| 2002/0155708 A1 | 10/2002 | Lo et al. | |
| 2002/0190329 A1 | 12/2002 | Arai et al. | |
| 2002/0197883 A1 | 12/2002 | Niimi et al. | |
| 2003/0000645 A1 | 1/2003 | Dornfest | |
| 2003/0027392 A1 * | 2/2003 | Gousev et al. | 438/287 |
| 2004/0038487 A1 | 2/2004 | Olsen | |
| 2004/0053472 A1 | 3/2004 | Kiryu et al. | |
| 2004/0175961 A1 | 9/2004 | Olsen | |

(Continued)

OTHER PUBLICATIONS

U.S. Appl. No. 11/167,526, filed Jun. 27, 2005.

(Continued)

*Primary Examiner*—Kevin M Picardat
(74) *Attorney, Agent, or Firm*—Patterson & Sheridan, LLP

(57) ABSTRACT

A method for processing a semiconductor substrate in a chamber includes forming a silicon oxynitride film using a two-step anneal process. The first anneal step includes annealing the silicon oxynitride film in the presence of an oxidizing gas that has a partial pressure of about 1 to about 100 mTorr, and the second anneal step includes annealing the silicon oxynitride film with oxygen gas that has a flow rate of about 1 slm. The first anneal step is performed at a higher chamber temperature and higher chamber pressure than the second anneal step.

20 Claims, 3 Drawing Sheets

U.S. PATENT DOCUMENTS

2004/0248392 A1    12/2004   Narwankar et al.
2005/0112827 A1*   5/2005    Anthony et al. ............. 438/287
2005/0130448 A1    6/2005    Olsen et al.

OTHER PUBLICATIONS

U.S. Appl. No. 11/178,749, filed Jul. 11, 2005.

International Search Report for International Application No. PCT/US2004/006974, dated Oct. 9, 2004.

Notification of First Office Action dated Dec. 21, 2007 for Chinese Application No. 200480007178.3.

International Search Report and Written Opinion for PCT/US07/65650, dated Oct. 10, 2007, copy consists of 9 pages.

* cited by examiner

SILICON OXYNITRIDE GATE DIELECTRIC FORMATION USING MULTIPLE ANNEALING STEPS

CROSS-REFERENCE TO RELATED APPLICATIONS

This application is a continuation-in-part of co-pending U.S. patent application Ser. No. 10/794,707, filed Mar. 4, 2004, which claims the benefit of U.S. Provisional Patent Application Ser. No. 60/453,057, filed Mar. 7, 2003. Each of the aforementioned related patent applications is herein incorporated by reference.

BACKGROUND OF THE INVENTION

1. Field of the Invention

Embodiments of the present invention generally relate to semiconductor processing including forming a silicon oxynitride film. More specifically, the present invention relates to a method for forming a silicon oxynitride film using plasma nitridation and a two step annealing process.

2. Description of the Related Art

As device geometries of integrated circuits and transistors have decreased, the gate drive current required by the transistors have increased. It is known that a gate drive current of a transistor increases as its gate capacitance increases, and the gate capacitance of a transistor is equal to k*A/d, where k is the dielectric constant of the gate dielectric (which is usually silicon oxide), d is the dielectric thickness, and A is the gate contact area. Thus, decreasing the dielectric thickness and increasing the dielectric constant of the gate dielectric are two ways of increasing the gate capacitance and the drive current.

Attempts have been made to reduce the thickness of dielectrics, such as reducing the thickness of silicon dioxide ($SiO_2$) dielectrics to below 20 Å. However, the use of $SiO_2$ dielectrics with thicknesses below 20 Å often results in undesirable performance and decreased durability. For example, boron from a boron doped electrode can penetrate through a thin $SiO_2$ dielectric into the underlying silicon substrate. In addition, there is typically an undesirable increase in the gate leakage current, i.e., tunneling current, that in turn increases the amount of power consumed by the gate. Thin $SiO_2$ gate dielectrics may also be susceptible to negative-channel metal-oxide semiconductor (NMOS) hot carrier degradation and to positive-channel metal-oxide semiconductor (PMOS) negative bias temperature instability (NBTI).

Nitridation of the $SiO_2$ layer has been employed as a way to reduce the thickness of the $SiO_2$ dielectric layer to below 20 Å. Plasma nitridation is used to incorporate nitrogen into the gate oxide. Nitridation provides high nitrogen concentration at the electrode/oxide interface. The high nitrogen concentration at the interface prevents boron penetration into the gate oxide. The bulk gate oxide dielectric, on the other hand, is lightly doped with nitrogen during the plasma nitridation process. The low nitrogen concentration of the bulk results in a film with lower equivalent oxide thickness (EOT) than the starting oxide, thereby reducing gate leakage. It is desirable to provide a dielectric with EOT<12 Å.

Annealing silicon oxynitride after nitridation improves channel mobility but at the expense of EOT increases as observed by performing peak transconductance measurements of traditionally annealed silicon oxynitride films. Channel mobility is degraded more at lower EOT thickness than at higher EOT thickness. Also, higher EOT decreases drive current of traditionally annealed silicon oxynitride films. Thus, an annealing process that provides films with desirable channel mobility, drive current, and EOT is needed.

SUMMARY OF THE INVENTION

The present invention provides a method for forming a thin silicon oxynitride layer with desired channel mobility and drive current. The method according to an embodiment of the present invention includes annealing the silicon oxynitride film with 1 to 100 mTorr oxidizing gas, which can be oxygen, nitrous oxide, or nitric oxide, and annealing the silicon oxynitride film with about 1 slm oxygen. The step of annealing the silicon oxynitride film with 1 to 100 mTorr oxidizing gas is performed at a higher temperature and higher pressure than the step of annealing the silicon oxynitride film with about 1 slm oxygen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
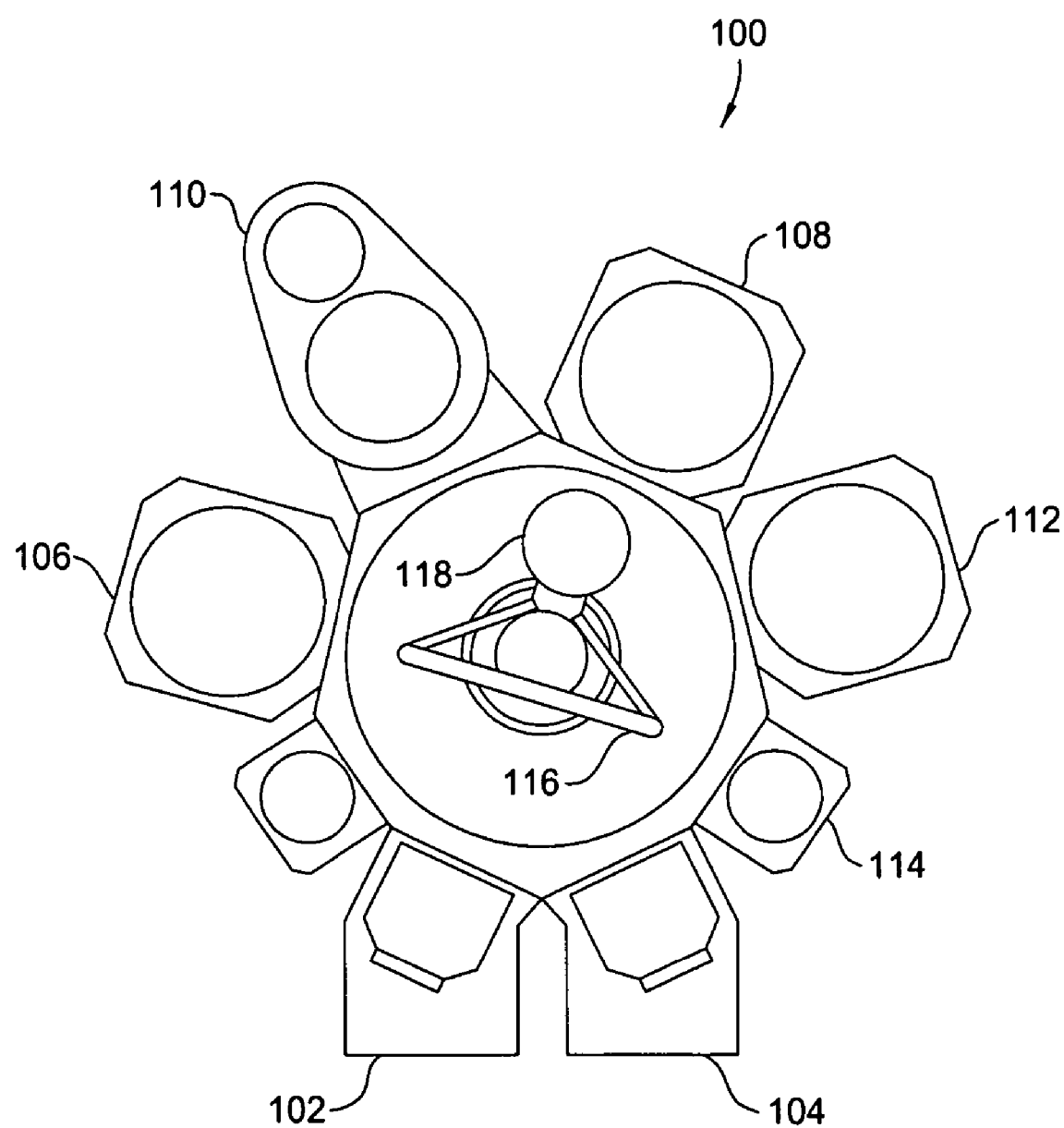
FIG. 1 is a schematic view of an integrated tool for processing semiconductor substrates.

FIG. 1 is a schematic view of an integrated tool 100 for processing semiconductor substrates according to various embodiments of the present invention. One example of the integrated tool 100 is the GATE STACK CENTURA™ integrated tool from Applied Materials, Inc. of Santa Clara, Calif. The integrated tool 100 includes loadlock chambers 102 and 104, rapid thermal anneal or process (RTP) chambers 106 and 108, a decoupled plasma nitridation (DPN) chamber 110, a deposition chamber 112, and a cool down chamber 114. The integration tool 100 also includes a substrate-handling tool 116 used to transfer a substrate 118 in and out of a particular processing chamber.

The substrate-handling tool 116 is located in a central transfer chamber in communication with each of the surrounding chambers. The loadlock chambers 102 and 104 house substrates to be processed. The deposition chamber 112 is a chemical or physical vapor deposition chamber that can be used to form a film or layer on a semiconductor substrate.

The RTP chambers 106 and 108 are chambers that can be configured to perform rapid thermal processing at a reduced pressure, e.g., about equal to or less than 10 Torr. Acceptable RTP chambers include RADIANCE XE™, RADIANCE XE PLUS™, AND RADIANCE™ RTP chambers which are commercially available from Applied Materials, Inc. of Santa Clara, Calif.

Figure 2:
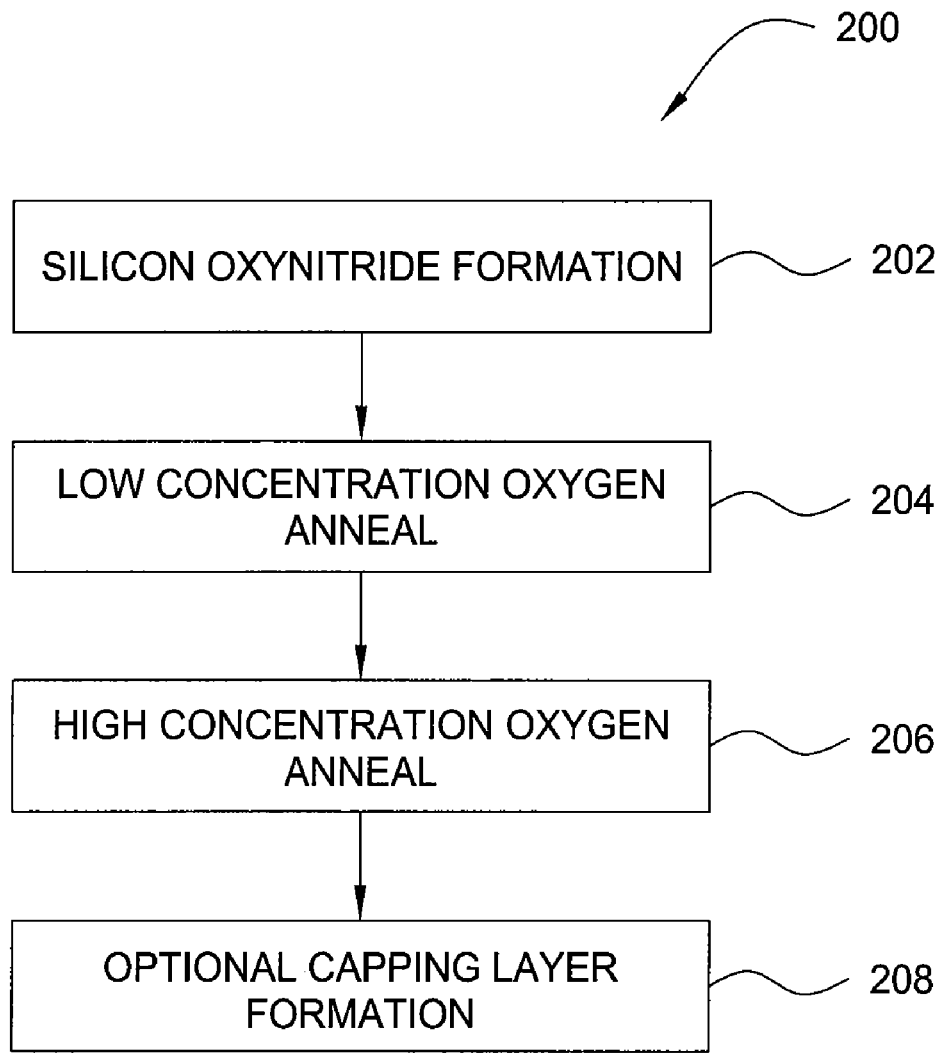
FIG. 2 is a flow chart of process steps to form an annealed silicon oxynitride film.

FIG. 2 is a flow chart of the process 200 to form an annealed silicon oxynitride film. Initially, a substrate is processed to form a layer of silicon oxide on the surface of the substrate. Next, the silicon oxide is treated to form a layer of silicon oxynitride with a nitridation process such as thermal nitridation or plasma nitridation during step 202. The formation of silicon oxynitride using plasma nitridation is disclosed in U.S. patent application Ser. No. 10/461,143, filed Jun. 12, 2003, which is incorporated by reference herein.

After the silicon oxynitride layer has been formed, the silicon oxynitride layer undergoes a two-step anneal process. The first step 204 of the anneal process is performed at a temperature of about 700° C. or higher for about 1 to about 120 seconds at a chamber pressure of about 100 mTorr to about 800 Torr. The first step 204 of the anneal process is performed with an inert, reducing, oxidizing, or combination gases. Inert gases include nitrogen, helium, and argon. Reducing gases include hydrogen. Oxidizing gases include oxygen, nitrous oxide, nitric oxide, and ozone. Combination gases include nitrogen and oxygen.

Flow rates of oxygen given in partial pressure are the partial pressure of oxygen and the balance of the gas flow to the chamber is some other gas, such as nitrogen. In the case where oxygen is supplied, the flow rate of oxygen should be selected to provide oxygen partial pressure of 1 to 100 mTorr. The oxygen partial pressure should be preferably about 1 to about 15 mTorr oxygen if the first anneal step is carried out at about 1000° C. The oxygen partial pressure is preferably about 10 to about 50 mTorr oxygen if the first anneal step is performed at 1050° C. If the first anneal step is carried out at about 1100° C., the partial pressure of oxygen is preferably about 75 to about 200 mTorr. Adding too much oxygen in the first anneal step is not desirable because it might cause overoxidizing.

To compare the film properties of films formed using several combinations of varied flow rates of nitrogen and oxygen at three different thermal anneal temperatures, saturated drive current as a function of gate current density was observed. The saturated drive current was greatest at a gate current density of 100 mA/mm$^2$ for a process using about 10 to about 50 mTorr oxygen when the first anneal step was performed at 1050° C.

The second step 206 of the anneal process is performed at a reduced pressure of about 10 mTorr to about 100 Torr at about 900 to about 1100° C. The second anneal step 206 is performed for about 1 to about 120 seconds. The second step 206 is controlled to provide a 0.1 to about 2 Å increase in the silicon oxynitride EOT. Oxygen or other oxidizing gas may be introduced into the RTP chamber. Oxidizing gases include oxygen, nitrous oxide, nitric oxide, and ozone. In a preferred second anneal step 206, oxygen is flowed into the chamber for about 15 seconds at a flow rate that provides oxygen partial pressure of about 0.5 Torr to about 3.0 Torr. As one example, a flow rate of about 1 slm may be used to provide the oxygen partial pressure within this range.

After the second anneal step 206, a capping layer may be formed over the surface of the silicon oxynitride in another chamber of the integrated tool during step 208. Additional processing may be performed in the tool or the substrate may be transferred to another tool.

Figure 3:
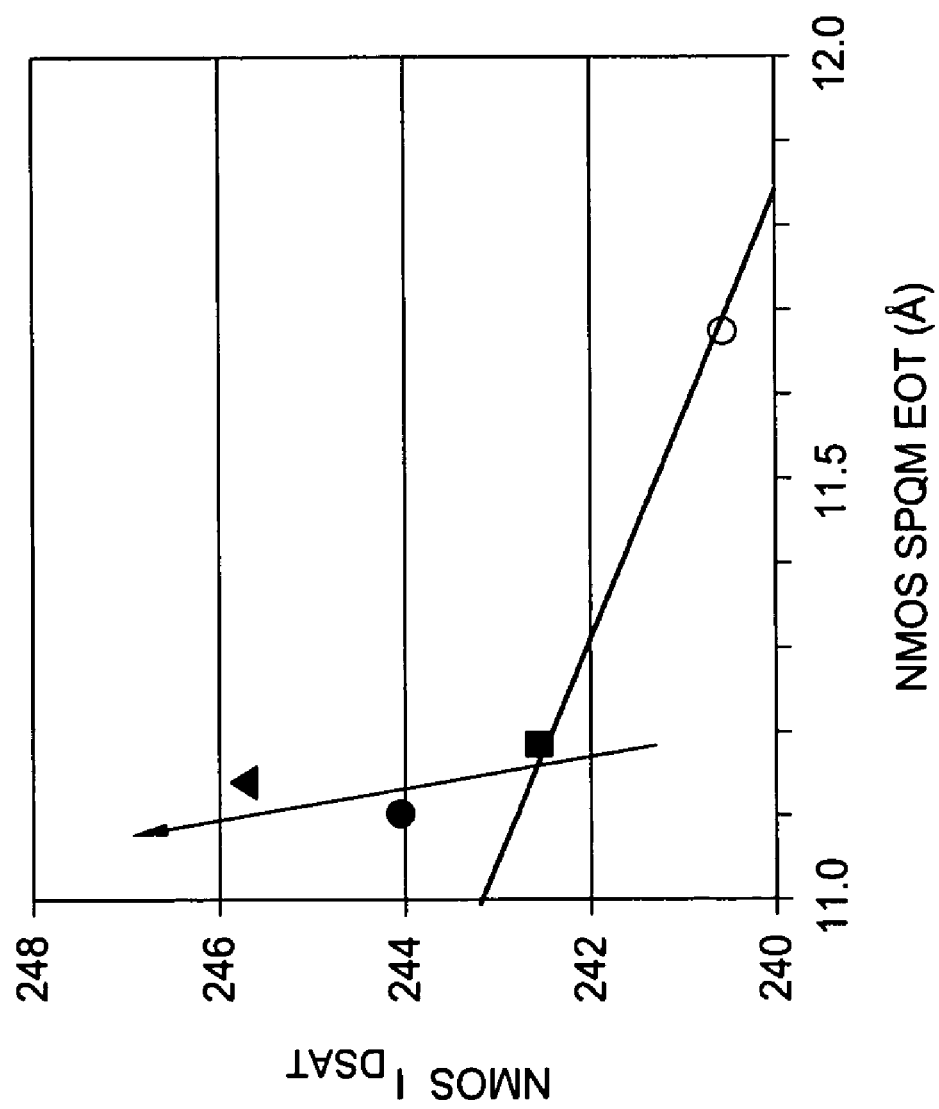
FIG. 3 is a plot of saturation drive current as a function of effective oxide thickness for a film formed with varied process conditions, including oxygen in both steps of a two step anneal process.

FIG. 3 is a plot of saturation drive current as a function of effective oxide thickness for a film formed with various process conditions, including processes according to embodiments of the present invention. The open circle indicates a one-step anneal performed at 1000° C. with 0.5 Torr oxygen for 15 seconds (nitrogen is the balance of each of the anneal steps), and the solid circle indicates a first anneal step performed at 1000° C. with nitrogen for 15 seconds and with a second anneal step of 0.5 Torr oxygen for 15 seconds. The solid triangle indicates a first anneal step performed at 1000° C. with nitrogen for 45 seconds and a second anneal step of 0.5 Torr oxygen for 15 seconds and the solid square indicates a first anneal step performed at 950° C. with nitrogen for 45 seconds and a second anneal step of 0.5 Torr oxygen for 15 seconds. According to these results, the two-step process according to embodiments of the present invention is better than the one-step anneal process. It is also preferred to use both oxygen and nitrogen in the first anneal step of the two-step anneal process. However, it is understood that this is the preferred embodiment and that other embodiments can be within the scope of the present invention.

Partial pressure of oxygen as a function of temperature for a film formed with various process conditions according to embodiments of the present invention was observed. More devices that were formed with oxygen in the first anneal step were acceptable than without oxygen in the first anneal step at 1000° C., 1050° C., and 1100° C. These results indicate that adding oxygen during the first anneal step carried out at higher temperatures provides more defect-free devices compared to adding no oxygen during such anneal step.

While the foregoing is directed to embodiments of the present invention, other and further embodiments of the invention may be devised without departing from the basic scope thereof, and the scope thereof is determined by the claims that follow.

I claim:

1. A method for processing a semiconductor substrate, comprising:

forming a silicon oxynitride film;

annealing the silicon oxynitride film in the presence of an oxidizing gas to form an environment that has an oxygen partial pressure of about 1 mTorr to about 100 mTorr; and annealing the silicon oxynitride film with an oxygen gas to form an environment that has an oxygen partial pressure of about 0.5 Torr to about 3.0 Torr.

2. The method of claim 1, wherein forming a silicon oxynitride film is performed by plasma nitridation.

3. The method of claim 1, wherein the annealing the silicon oxynitride film in the presence of an oxidizing gas to form an environment that has an oxygen partial pressure of about 1 to about 100 mTorr is performed at about 700° C. or higher.

4. The method of claim 3, wherein the annealing the silicon oxynitride film in the presence of an oxidizing gas to form an environment that has an oxygen partial pressure of about 1 to about 100 mTorr is performed at about 1000° C. to about 1100° C.

5. The method of claim 1, wherein the annealing the silicon oxynitride film in the presence of an oxidizing gas to form an environment that has an oxygen partial pressure of about 1 to about 100 mTorr is performed for about 1 second to about 120 seconds.

6. The method of claim 1, wherein the annealing the silicon oxynitride film in the presence of an oxidizing gas to form an environment that has an oxygen partial pressure of about 1 to about 100 mTorr is performed at a chamber pressure of about 100 mTorr to about 800 Torr.

7. The method of claim 1, wherein the oxidizing gas is a gas selected from oxygen, nitrous oxide, nitric oxide, and ozone.

8. The method of claim 1, wherein the oxidizing gas is oxygen.

9. The method of claim 1, wherein the annealing the silicon oxynitride film in the presence of an oxidizing gas to form an environment that has an oxygen partial pressure of about 1 to about 100 mTorr further comprises annealing the silicon oxynitride film with a reducing gas.

10. The method of claim 9, wherein the reducing gas is hydrogen.

11. The method of claim 1, wherein the annealing the silicon oxynitride film in the presence of an oxidizing gas to form an environment that has an oxygen partial pressure of about 1 to about 100 mTorr further comprises annealing the silicon oxynitride film with an inert gas.

12. The method of claim 11, wherein the inert gas is a gas selected from nitrogen, helium, and argon.

13. The method of claim 1, wherein the annealing the silicon oxynitride film with oxygen gas that has a flow rate of about 1 slm is performed at about 900° C. to about 1100° C.

14. The method of claim 1, wherein the annealing the silicon oxynitride film with oxygen gas that has a flow rate of about 1 slm is performed at a pressure of about 10 mTorr to about 100 Torr.

15. The method of claim 1, wherein the annealing the silicon oxynitride film with oxygen gas to form an environment that has an oxygen partial pressure of about 0.5 Torr to about 3.0 Torr is performed for about 1 second to about 120 seconds.

16. A method for annealing a semiconductor substrate that is disposed in a chamber and has a silicon oxynitride film, comprising:

flowing an oxidizing gas into the chamber at a chamber temperature of about 1000° C. to about 1100° C. to provide an oxygen partial pressure of about 1 about 100 mTorr; and flowing an oxygen gas into the chamber to provide an oxygen partial pressure of about 0.5 Torr to about 3.0 Torr, wherein said flowing an oxidizing gas into the chamber is performed at a higher temperature and higher chamber pressure than said an oxygen gas into the chamber.

17. The method of claim 16, wherein said flowing an oxidizing gas into the chamber is performed at about 1000° C.

18. The method of claim 16, wherein said flowing an oxidizing gas into the chamber is performed for about 1 second to about 120 seconds.

19. The method of claim 16, wherein said flowing an oxidizing gas into the chamber is performed at a chamber pressure of about 100 mTorr to about 800 Torr.

20. The method of claim 16, wherein the oxidizing gas is a gas selected from oxygen, nitrous oxide, nitric oxide and ozone.

* * * * *

UNITED STATES PATENT AND TRADEMARK OFFICE
CERTIFICATE OF CORRECTION

| | | |
|---|---|---|
| PATENT NO. | : 7,429,540 B2 | Page 1 of 1 |
| APPLICATION NO. | : 11/397010 | |
| DATED | : September 30, 2008 | |
| INVENTOR(S) | : Olsen | |

It is certified that error appears in the above-identified patent and that said Letters Patent is hereby corrected as shown below:

In the Claims:

Column 6, Claim 16, Line 3, please insert --to-- after 1.

Signed and Sealed this

Tenth Day of February, 2009

JOHN DOLL
*Acting Director of the United States Patent and Trademark Office*